United States Patent
Holderer et al.

(10) Patent No.: US 7,400,460 B2
(45) Date of Patent: Jul. 15, 2008

(54) METHOD FOR CONNECTION OF AN OPTICAL ELEMENT TO A MOUNT STRUCTURE

(75) Inventors: Hubert Holderer, Oberkochen (DE); Bernhard Gellrich, Aalen (DE); Dirk Rexhaeuser, Masserberg (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/599,784

(22) PCT Filed: Apr. 16, 2005

(86) PCT No.: PCT/EP2005/004052

§ 371 (c)(1),
(2), (4) Date: Oct. 10, 2006

(87) PCT Pub. No.: WO2005/103788

PCT Pub. Date: Nov. 3, 2005

(65) Prior Publication Data

US 2007/0171552 A1    Jul. 26, 2007

Related U.S. Application Data

(60) Provisional application No. 60/565,346, filed on Apr. 26, 2004.

(51) Int. Cl.
*G02B 7/02*    (2006.01)

(52) U.S. Cl. .................................. 359/819; 359/811
(58) Field of Classification Search ............... 359/819
See application file for complete search history.

(56) References Cited

U.S. PATENT DOCUMENTS

| 5,991,101 | A | * | 11/1999 | Holderer et al. ............. 359/819 |
| 6,108,144 | A | | 8/2000 | Holderer et al. |
| 6,299,657 | B1 | | 10/2001 | Schubert et al. |
| 6,392,284 | B1 | | 5/2002 | Thakur et al. |
| 2002/0167740 | A1 | | 11/2002 | Osterried et al. |
| 2006/0023186 | A1 | * | 2/2006 | Binnard .................. 355/53 |
| 2006/0158749 | A1 | * | 7/2006 | Sorg et al. ................. 359/819 |

FOREIGN PATENT DOCUMENTS

| DE | 19735760 A1 | 2/1999 |
| DE | 19757529 A1 | 6/1999 |
| DE | 101 21 346 A1 | 11/2002 |
| GB | 2070487 A | 9/1981 |
| WO | 03/077036 A1 | 9/2003 |
| WO | 2005/054953 A2 | 6/2005 |

* cited by examiner

*Primary Examiner*—Jordan M. Schwartz
*Assistant Examiner*—James C Jones
(74) *Attorney, Agent, or Firm*—GrayRobinson, PA

(57) ABSTRACT

The invention relates to a method for connection of an optical element to a mount structure, whereby in a first step the optical element is connected to the mount structure and in a second step the optical element is welded to the mount structure in the region of the connection.

22 Claims, 3 Drawing Sheets

METHOD FOR CONNECTION OF AN OPTICAL ELEMENT TO A MOUNT STRUCTURE

BACKGROUND OF THE INVENTION

1. Field of the Invention

The invention relates to a method for connection of an optical element to a mount structure, a use of the optical element connected to the mount structure by means of the method, an arrangement comprising an optical element and a mount structure connected to the optical element, and a projection objective for microlithography comprising such an arrangement.

2. Description of the Related Art

U.S. Pat. No. 5,991,101 describes the connection of a lens to a holder by means of soldering.

U.S. Pat. No. 6,108,144 reveals a method for welding a large optical component to a metallic mount.

Further possibilities for connection of optical elements to mount structures are described in U.S. Pat. No. 6,229,657 B1 or U.S. Pat. No. 6,392,284 B1.

Furthermore, the combination of wringing with adhesive bonding is known from the general prior art.

If the resolution of a lithography objective equipped with a plurality of optical elements is intended to be improved, then one possibility consists in inserting a so-called immersion medium between the last optical element and the wafer to be exposed. The numerical aperture can be increased to a value of >1.0 in this way. The immersion medium, for example water, is usually present at the connection of the terminating element to a mount structure in such a case. Said immersion medium may attack the connection between the optical element and the mount structure and damage it in this way. Said damage may proceed to such an extent that the immersion medium can penetrate into the interior of the lithography objective.

SUMMARY OF THE INVENTION

Therefore, it is an object of the present invention to provide a method for connection of an optical element to a mount structure which is suitable in particular, but not exclusively, for optical elements used in immersion lithography and can be carried out with simple means in order to achieve a tight connection between the optical element and the mount structure.

This object is achieved according to the invention by means of a method for the connection of an optical element to a mount structure, the optical element being connected to the mount structure in a first step, and the optical element being soldered to the mount structure in the region of the connection in a second step.

The soldering of the optical element to the mount structure in the region of the connection protects said connection, so that it cannot be attacked or damaged by external influences, such as immersion liquid, for example. This results overall in a connection between the optical element and the mount structure which is very exact and nevertheless extremely tight particularly against the ingress of liquids. Furthermore, the strength of the connection between the optical element and the mount structure is also increased by the soldering according to the invention.

In a particularly advantageous development of the invention it may be provided that in the first step the optical element is connected to the mount structure by wringing. The connection of the optical element to the mount structure by wringing ensures a very good positional stability of the optical element, which is an extremely important requirement in various optical applications.

If, in one advantageous development of the invention, a solder having a low melting point is used for producing the soldering connection, then a very small thermal expansion of the optical element and of the mount structure may be expected on account of the low temperature required for soldering, with the result that only small stresses are introduced into the connection and into the components.

In practice, a tin-indium solder has proved to be particularly suitable for this purpose of use on account of its advantageous properties, in particular on account of the low melting point and the lack of toxicity.

If the solder is acted on during the heating of the solder by means of ultrasound, then it is possible to break up the oxide layer of the solder and to comminute it in this way, with the result that the optical element cannot be impaired by such an oxide layer.

As an alternative or else, if appropriate, in addition to the use of ultrasound, it is possible to remove an oxide layer of the solder chemically and/or mechanically prior to soldering.

If soldering is effected without a flux and the application of ultrasound is nevertheless intended to be dispensed with, it may be advantageous if a solderable layer is applied on the optical element and on the mount structure prior to soldering.

In this context, particularly advantageous properties arise for the solderable layer if nickel is used for the latter and titanium-tungsten is used as adhesion promoter.

It has furthermore proved to be advantageous if gold is applied to the solderable layer comprising titanium-tungsten and nickel as a protective layer.

In this case, during later soldering, the heated solder resolves the protective layer and combines with the underlying solderable layer, thus resulting overall in an optimum connection of the solder to the optical element and the mount structure.

In order to prevent oxidation of the solder during the soldering operation, in a further advantageous refinement of the invention it may be provided that the soldering is performed in vacuo.

If the solder is applied in the form of a fillet seam, this results in a particularly simple procedure that can be carried out without any problems.

As an alternative to this, it may also be provided that a gap is introduced into the optical element and/or the mount structure, the solder being introduced into the gap in the form of a gap seam. This procedure reduces the free surface of the solder.

A particularly preferred use of the optical element connected to the mount structure by means of the method according to the invention consists in using said optical element in an objective.

The optical element and the mount structure are particularly highly suitable in a lithography objective and extremely highly suitable in an immersion lithography objective.

An arrangement comprising an optical element and a mount structure connected to the optical element, a first joint using wringing technology and a second joint formed as a soldering connection being provided, is specified in claim 18.

A projection objective for microlithography comprising an arrangement of this type emerges from claim 22.

The invention is described below with reference to the drawings.

DETAILED DESCRIPTION

Figure 1:
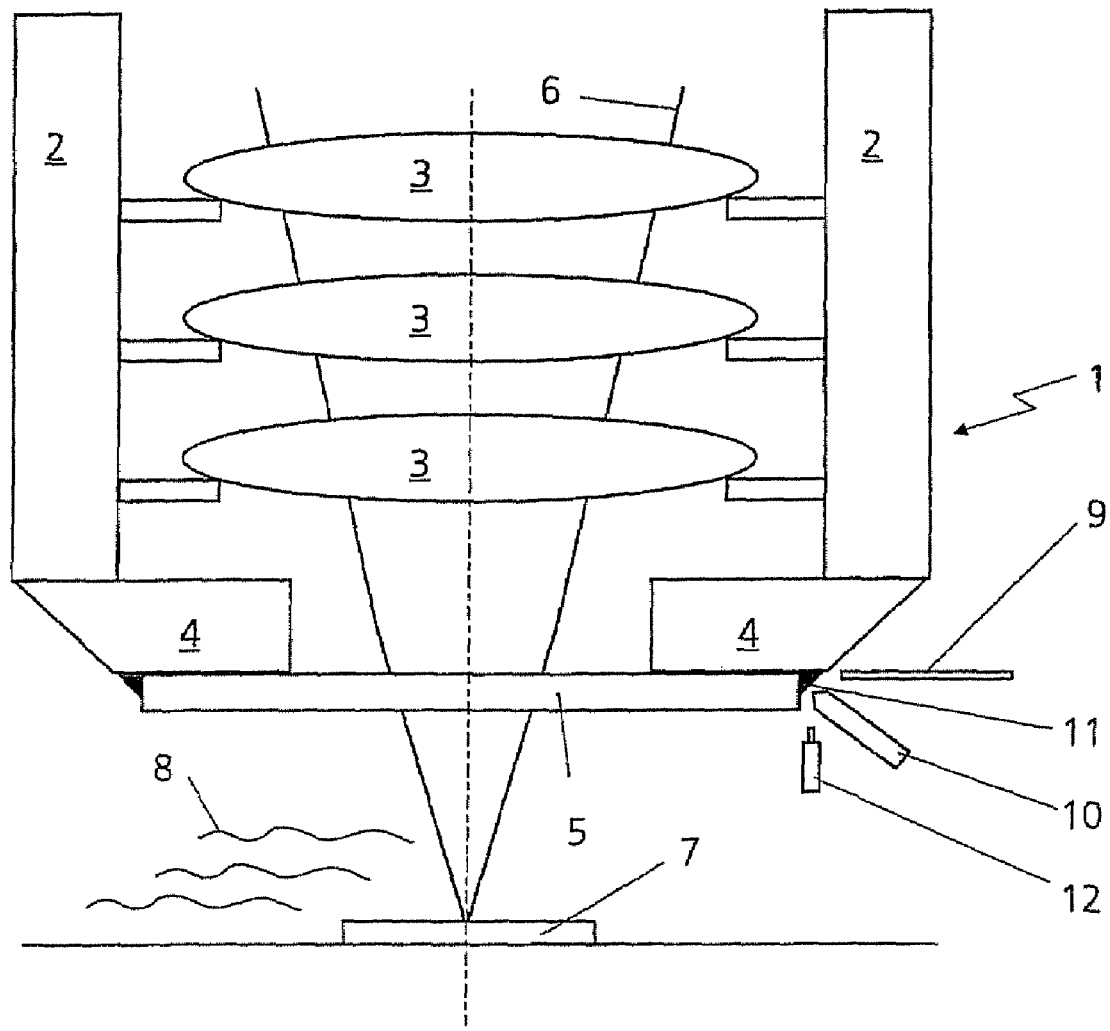
FIG. 1 shows an optical element connected to a mount structure by means of a first embodiment of the method according to the invention, said optical element being used in an objective.

FIG. 1 shows a projection objective formed as a lithography objective 1, which is suitable in particular for immersion lithography but can also be used for other types of lithography and also for other optical purposes. Since immersion lithography is known per se, not all of the details of this method are discussed herein. The lithography objective 1 has a housing 2, which is indicated extremely schematically and within which a plurality of optical elements 3, preferably lenses, are arranged in a manner known per se, the number and arrangement of which are only to be regarded as by way of example, however. The lithography objective 1 may be formed essentially according to DE 103 56 730.5, the content of which is included in the present application by reference. The lithography objective 1 can be used at a defined wavelength, e.g. 632.8 nm, 365 nm, 248 nm, 193 nm, 157 nm, etc.

Situated at the underside of the housing 2 is a mount structure 4, which is formed as a holder, is formed in annular fashion in the present case and is removably connected to the housing 2 by means of methods known per se. A further optical element 5 is fitted to the mount structure 4, which optical element in this case forms the last optical element in the course direction of a beam path 6 through the lithography objective 1. Such a last optical element is also referred to as a terminating element or terminating plate and may be exchangeable relative to the mount structure 4. The optical element 5 might also be, if appropriate, a mirror or an arbitrarily embodied lens. The devices required for producing the beam path 6 are known per se and are therefore not illustrated in the figures. In order to connect the optical element 5 to the mount structure 4, firstly the areas of these two components that come into contact with one another are produced with a very low degree of surface roughness, which can be achieved for example by grinding and subsequent polishing. The optical element 5 is then wrung onto the mount structure 4, thus resulting in a very good tightness of the connection between the optical element 5 and the mount structure 4. Since, in the present case when using the lithography objective 1, an immersion medium 8 may be situated between the optical element 5 and a wafer 7 produced by the lithography objective 1, in order to improve the tightness of this wringing connection between the optical element 5 and the mount structure 4, the optical element 5 is additionally soldered to the mount structure 4 in the region of the wringing connection, as is described in more detail below.

In the region of the wringing connection, which forms a first joint, a solder 9 is supplied, which is heated and thus melted by the supply of heat, for example by means of a soldering iron 10. The molten solder 9 produces a soldering seam 11, which, in the present case, is formed as a fillet seam and extends from the mount structure 4 to the optical element 5 and thus forms a second joint surrounding the first joint. A solder 9 having a low melting point is preferably used, in particular a tin-indium solder, the term "solder having a low melting point" denoting a melting point of preferably <200° C. During the heating of the solder 9, the solder 9 is acted on by an ultrasonic probe by means of ultrasound in order to break up possibly oxidized locations on the surface of the solder 9 and to comminute them and reduce them in size in this way. Through the action of the ultrasound, furthermore, the oxygen atoms (in the case of quartz) or the fluorine atoms (in the case of calcium fluoride) are also excited and react with the solder 9, thereby improving the connection between the material of the optical element 5 and the solder 9. The ultrasonic probe 12 is preferably arranged relative to the optical element 5 and the mount structure 4 such that an antinode of the ultrasonic oscillation is situated directly at the surface of the components or of the solder 9.

The ultrasonic soldering described makes it possible to carry out soldering without particular pretreatment of the components to be soldered, to be precise even when the optical element 5 and the mount structure 4 both comprise quartz ($SiO_2$) or calcium fluoride ($CaF_2$). Furthermore, the indium-containing solder is very well suited to ultrasonic soldering since indium combines very well with the ultrasound-activated oxygen within the quartz. During soldering, particularly if one of the components comprises quartz, care should be taken to ensure that the ultrasound is not applied to one and the same location for too long, in order not to extract too much oxygen from the quartz. If the optical element 5 and/or the mount structure 4 comprise calcium fluoride, this risk of oxygen depletion is not present. As a result of dispensing with flux, vapors that would otherwise condense on the optical element 5 and damage the latter do not arise during soldering.

Figure 2:
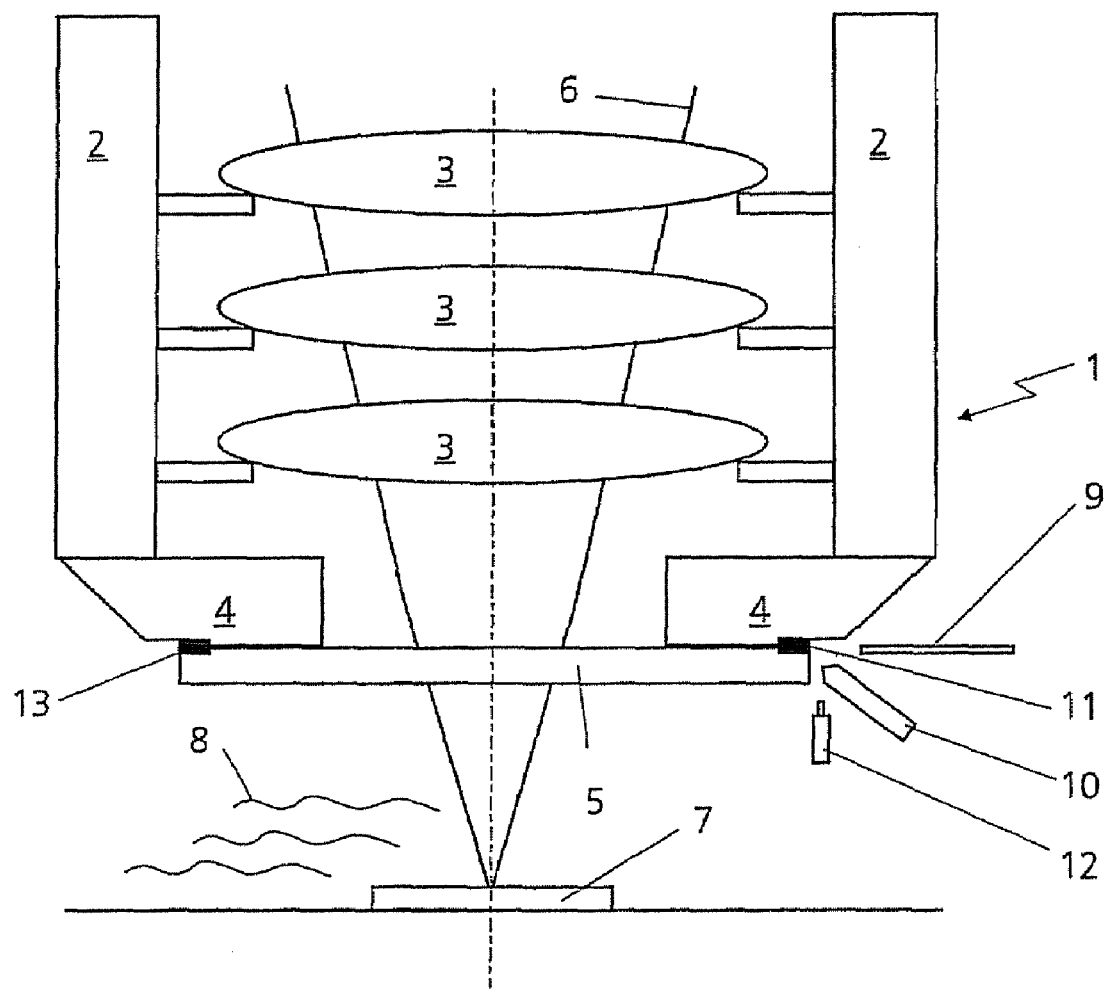
FIG. 2 shows an alternative embodiment of the method according to the invention.

A different form of the soldering seam 11 is shown by the method for connection of the optical element 5 to the mount structure 4 that is described with reference to FIG. 2. In this case, a gap 13 is introduced in the region of the wringing connection between the optical element 5 and the mount structure 4, which gap may extend both into the mount structure 4 and into the optical element 5. The solder 9 is subsequently supplied to the gap 13, so that the soldering seam 11 acquires the form of a gap seam or I seam. This results in a smaller free area of the solder 9.

Figure 3:
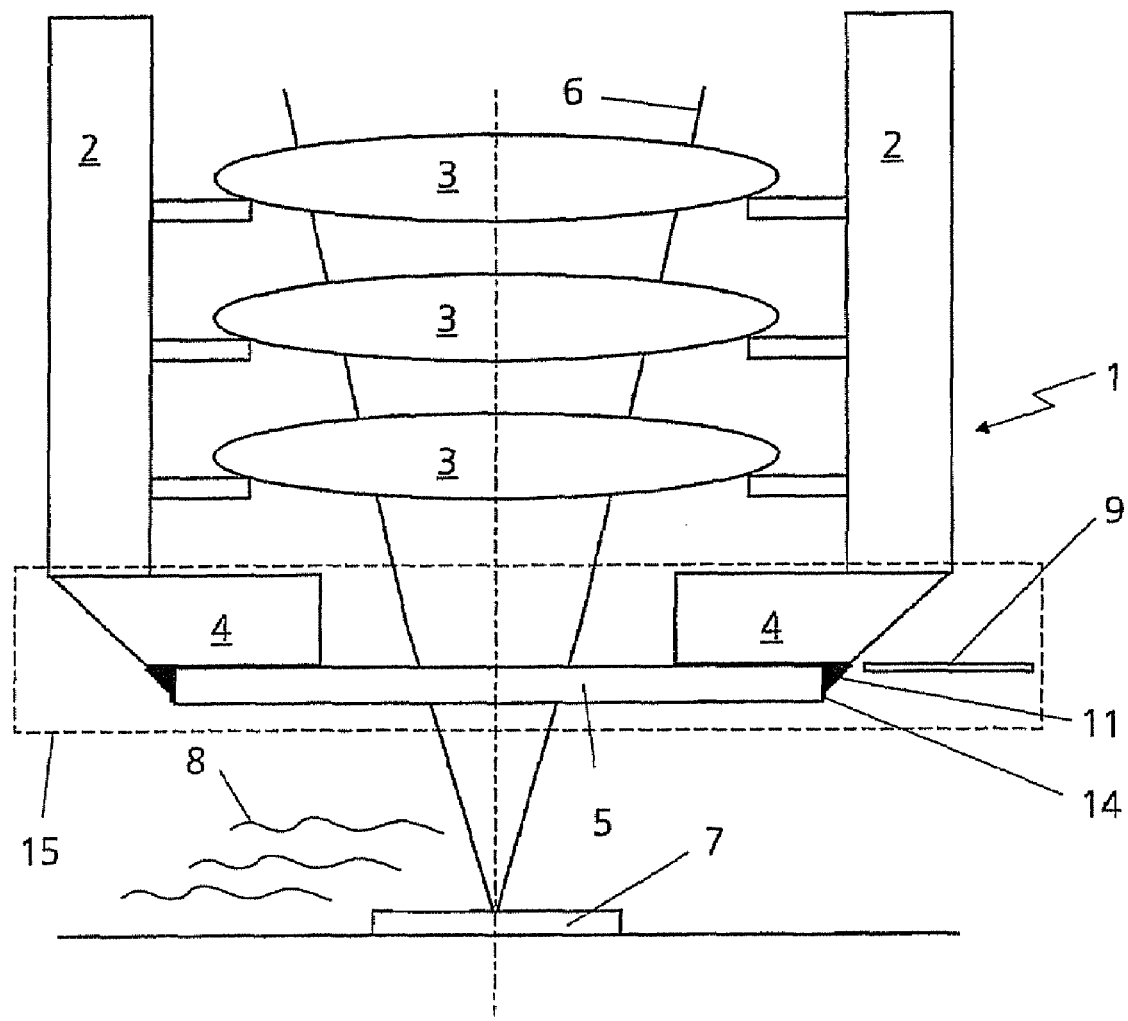
FIG. 3 shows a further alternative embodiment of the method according to the invention.

A further method for connection of the optical element 5 to the mount structure 4 is described with reference to FIG. 3. In this case, as also in the case of soldering by means of ultrasound, no flux is used, rather a solderable layer 14 is applied on the optical element 5 and on the mount structure 4 prior to soldering. Preferably, as material for the solderable layer 14, use is made of 50 to 200 nm of titanium-tungsten as adhesion promoter and 500 to 5000 nm of nickel as the actual solderable layer, gold as protection against oxidation preferably being applied to said solderable layer 14.

The solder 9 is supplied in this case, too, a possibly present oxide layer of the solder 9 being removed mechanically or chemically, e.g. by means of acid, prior to soldering. Afterward, the solder 9 is positioned on the soldering location and is heated within a vacuum furnace to a temperature slightly above the liquidus temperature of the solder 9. After the temperature is kept above the liquidus temperature for a few minutes, slow cooling may be effected in order to prevent the stresses in the solder 9 from becoming too high. During soldering, the heated solder 9 resolves the protective layer made of gold or forms an alloy with the gold and combines with the solderable layer 14 made of nickel. After the solder 9 has cooled, the result is an even better connection of said solder to the optical element 5 and to the mount structure 4. Furthermore, the use of gold as a protective layer increases the melting point of the solder 9 after cooling, so that the soldering connection overall is less temperature-sensitive and, during later use, can have applied to it a higher temperature than is necessary for soldering.

The vacuum furnace required for performing the soldering in vacuo is indicated by the dashed line designated by the reference symbol "15". Instead of the vacuum furnace 15, it is also possible, as in the case of ultrasonic soldering, to use the soldering iron 10, provided that the soldering location is readily accessible. In addition, the ultrasonic probe 12 can be used in this method, too, in which case a very much smaller amount of ultrasound has to be used here in comparison with the ultrasonic soldering described with reference to FIGS. 1 and 2. Instead of a vacuum, an inert or a reducing atmosphere may also be used for soldering.

As can be discerned, in the method in accordance with FIG. 3, too, a soldering seam 11 arises in the form of a fillet seam, but it is also possible to introduce the gap 13 described with reference to FIG. 2 between the optical element 5 and the mount structure 4 in order to embody the soldering seam 11 as a gap seam or I seam.

Instead of supplying the solder 9 to the soldering location, it is also possible to place said solder onto the soldering location, it being possible for the solder 9 to be present in the form of a ring, for example, in such a case.

In order to be able to achieve an exchangeability of the optical element 5, it is also possible, in a manner that is not illustrated, to solder onto said optical element a metal bellows or the like and to connect the latter to the objective 1 e.g. by screw connection. For the positioning of the optical element 5, the latter would be wrung onto the mount structure 4 in this case, too. The metal bellows could simultaneously also serve as a sealing element for the wringing connection.

Although not illustrated in this way in the drawings, the optical element 5 and the mount structure 4 are usually not soldered to one another in the state in which the mount structure 4 is fitted to the housing 2. Rather, the fitting of the mount structure 4 with the optical element 5 on the housing 2 is not effected until after soldering. This becomes particularly clear in the embodiment in accordance with FIG. 3, in which, of course, the vacuum chamber 15 does not accommodate the entire lithography objective 1, but rather only the optical element 5 and the mount structure 4. The drawings are merely intended to illustrate the later use of the connection of the optical element 5 to the mount structure 4.

What is claimed is:

1. A method for connection of an optical element to a mount structure, said method comprising the steps of:
    connecting the optical element to the mount structure by wringing to form a wrung connection between the optical element and the mount structure in a first step, and, in a second step, soldering the optical element to the mount structure in the region of the wrung connection.

2. The method as claimed in claim 1, wherein a solder having a low melting point is used for the soldering.

3. The method as claimed in claim 2, wherein tin-indium solder is used for the soldering.

4. The method as claimed in claim 1, wherein the solder is acted on by ultrasound during heating of the solder.

5. The method as claimed in claim 1, wherein an oxide layer of the solder is chemically removed prior to soldering.

6. The method as claimed in claim 1, wherein an oxide layer of the solder is mechanically removed prior to soldering.

7. The method as claimed in claim 1, wherein a solderable layer is applied on said optical element and on said mount structure prior to the soldering.

8. A method for connecting of an optical element to a mount structure, said method comprising the steps of: connecting the optical element to the mount structure in a first step, and, in a second step, soldering the optical element to the mount structure with nickel being used for the solderable layer and titanium-tungsten being used as an adhesion promoter.

9. The method as claimed in claim 8, wherein gold is applied as a protective layer to the solderable layer.

10. The method as claimed in claim 1, wherein the soldering is performed in a vacuum.

11. The method as claimed in claim 1, wherein the soldering comprises the step of applying solder to form a fillet seam.

12. The method as claimed in claim 1, further comprising the step of introducing a gap being introduced into at least one of said optical element and said mount structure, and wherein said second step comprises the step of introducing solder into said gap to form of a gap seam.

13. The method as claimed in claim 1, wherein said optical element comprises a connection element of an objective.

14. Use of the optical element connected to the mount structure by means of the method as claimed in claim 1 in an objective.

15. The use as claimed in claim 14, wherein the objective is a lithography objective.

16. The use as claimed in claim 15, wherein the lithography objective is an immersion lithography objective.

17. An apparatus, comprising:
    an optical element, and a mount structure, said optical element and said mount structure being connected to one another by way of a first joint and a second joint, said first joint comprising a wrung connection between said optical element and said mount structure, said second joint comprising a solder connection between said optical element and said mount structure, said second joint being formed in the region of said first joint.

18. An apparatus as claimed in claim 17, wherein the mount structure is formed in annular fashion.

19. An apparatus as claimed in claim 17, wherein the second joint surrounds the first joint.

20. A projection objective for microlithography said projection objective, comprising:
    an optical element and a mount structure, said optical element and said mount structure being connected to one another by way of a first joint and a second joint, said first joint comprising a wrung connection between said optical element and said mount structure, said second joint comprising a solder joint between said optical element and said mount structure.

21. A projection objective as claimed in claim 20 wherein said solder joint comprises a soldering seam formed using a method which comprises the step of heating solder to a molten state.

22. A projection objective for carrying out immersion microlithography using an immersion medium, said projection objective comprising:
    an optical element and a mount structure, said optical element and said mount structure being connected to one another by way of a first joint and a second joint, said first joint comprising a wrung joint between said optical element and said mount structure, said second joint comprising a solder joint formed between said optical element and said mount structure, said solder joint being located to prevent ingress of the immersion fluid into said first joint to protect said wrung joint from being adversely affected by the immersion fluid.

* * * * *